(12) United States Patent
Tanous et al.

(10) Patent No.: US 10,148,547 B2
(45) Date of Patent: Dec. 4, 2018

(54) HARDWARE TRIGGER GENERATION FROM A DECLARATIVE PROTOCOL DESCRIPTION

(71) Applicant: TEKTRONIX, INC., Beaverton, OR (US)

(72) Inventors: Edward F. Tanous, Lake Oswego, OR (US); Keith D. Rule, Beaverton, OR (US); James Feist, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 61 days.

(21) Appl. No.: 14/574,111

(22) Filed: Dec. 17, 2014

(65) Prior Publication Data

US 2016/0119217 A1 Apr. 28, 2016

Related U.S. Application Data

(60) Provisional application No. 62/068,384, filed on Oct. 24, 2014.

(51) Int. Cl.
| | |
|---|---|
| *G06F 15/173* | (2006.01) |
| *H04L 12/26* | (2006.01) |
| *G01R 31/319* | (2006.01) |
| *G11C 29/56* | (2006.01) |

(52) U.S. Cl.
CPC ........ *H04L 43/18* (2013.01); *G01R 31/31903* (2013.01); *G11C 29/56* (2013.01); *H04L 43/10* (2013.01)

(58) Field of Classification Search
CPC .............. G06F 17/30985; G06F 9/444; G06F 17/2247; H04L 63/1416
See application file for complete search history.

(56) References Cited

U.S. PATENT DOCUMENTS

| 5,121,342 | A | 6/1992 | Szymborski et al. |
| 7,188,168 | B1 * | 3/2007 | Liao ........................ H04L 43/18 709/224 |
| 7,260,558 | B1 * | 8/2007 | Cheng ............... G06F 17/30985 706/12 |
| 7,596,809 | B2 * | 9/2009 | Chien ................... G06F 21/552 713/188 |
| 7,689,530 | B1 * | 3/2010 | Williams, Jr. .... G06F 17/30985 706/62 |
| 8,051,085 | B1 * | 11/2011 | Srinivasan .......... H04L 63/1416 707/737 |

(Continued)

FOREIGN PATENT DOCUMENTS

EP 2336790 B1 2/2014

OTHER PUBLICATIONS

Extended European Search Report for European Patent Application No. 15190949.6, dated Mar. 21, 2016, 10 pgs.

(Continued)

*Primary Examiner* — Shean Tokuta
(74) *Attorney, Agent, or Firm* — Miller Nash Graham & Dunn; Andrew J. Harrington

(57) ABSTRACT

A test-and-measurement instrument is described. A state machine, corresponding to a regular expression, can be stored in the test-and-measurement instrument. The state machine can be modified to reflect a trigger condition received from a user. The modified state machine can then be used to invoke a trigger when the condition is met in the bits of a bit stream.

17 Claims, 13 Drawing Sheets

```
state Begin packet Register0Write
{
 Begin,
 SlaveAddress:4
 1,
 data:7,
 parity:1
} packet RegisterRead
{
 Begin,
 SlaveAddress:4,
 0, 1, 1,
 address:5,
 parity:1,
 buspark:1,
 data:8,
 parity:1
} packet RegisterWrite
{
 Begin,
 SlaveAddress:4,
 0, 1, 0,
 address:5,
 parity:1,
 data:8,
 parity:1
}
```

(56) References Cited

U.S. PATENT DOCUMENTS

| | | | |
|---|---|---|---|
| 8,281,395 B2 | 10/2012 | Pawlowski | |
| 8,479,069 B2 | 7/2013 | Miller et al. | |
| 8,494,985 B1* | 7/2013 | Keralapura | H04L 63/0245 706/12 |
| 8,516,456 B1* | 8/2013 | Starovoitov | G06F 8/427 717/141 |
| 8,525,548 B2 | 9/2013 | Hutchings et al. | |
| 8,577,817 B1* | 11/2013 | Keralapura | G06N 99/005 370/235 |
| 8,862,603 B1* | 10/2014 | Watson | G06F 17/30985 707/712 |
| 9,270,641 B1* | 2/2016 | Preston | H04L 63/0245 |
| 2002/0104051 A1 | 8/2002 | Gupta | |
| 2004/0225999 A1* | 11/2004 | Nuss | G06F 8/31 717/114 |
| 2005/0108630 A1* | 5/2005 | Wasson | G06F 17/241 715/230 |
| 2005/0228791 A1* | 10/2005 | Thusoo | G06F 17/30911 |
| 2005/0228818 A1* | 10/2005 | Murthy | G06F 17/2205 |
| 2006/0005241 A1* | 1/2006 | Zhao | G06F 21/554 726/22 |
| 2006/0085389 A1* | 4/2006 | Flanagan | G06F 17/30985 |
| 2006/0200714 A1 | 9/2006 | Kamano et al. | |
| 2007/0130140 A1* | 6/2007 | Cytron | G06F 17/30985 |
| 2007/0282833 A1 | 12/2007 | McMillen | |
| 2008/0059464 A1* | 3/2008 | Law | H04L 45/742 |
| 2008/0072140 A1* | 3/2008 | Vydiswaran | G06F 17/2211 715/243 |
| 2008/0098207 A1 | 4/2008 | Reid et al. | |
| 2008/0295079 A1* | 11/2008 | Yiftachel | G06F 11/3684 717/126 |
| 2008/0301135 A1* | 12/2008 | Alves | G06F 17/30442 |
| 2009/0216513 A1* | 8/2009 | Pidan | G06F 17/504 703/14 |
| 2009/0276506 A1* | 11/2009 | Tiwari | G06F 17/248 709/220 |
| 2010/0057737 A1* | 3/2010 | Srinivasan | G06K 9/62 707/E17.039 |
| 2010/0114811 A1* | 5/2010 | Lambov | G06N 5/02 706/48 |
| 2010/0169311 A1* | 7/2010 | Tengli | G06F 17/30864 707/736 |
| 2010/0192225 A1* | 7/2010 | Ma | G06F 17/30985 726/23 |
| 2010/0205411 A1* | 8/2010 | Lunteren | G06F 17/30985 712/222 |
| 2010/0217936 A1* | 8/2010 | Carmichael | C07D 217/08 711/118 |
| 2011/0093496 A1* | 4/2011 | Bando | G06F 17/30985 707/769 |
| 2011/0134979 A1* | 6/2011 | Rule | G01R 13/0254 375/224 |
| 2011/0258210 A1* | 10/2011 | Agarwal | G06F 17/30985 707/758 |
| 2011/0276302 A1 | 11/2011 | Rivoir | |
| 2012/0124588 A1 | 5/2012 | Sinha et al. | |
| 2012/0130932 A1* | 5/2012 | Veanes | G06F 11/3608 706/46 |
| 2012/0158768 A1* | 6/2012 | Lamanna | G06F 17/30958 707/769 |
| 2012/0290736 A1* | 11/2012 | McMillen | H04L 63/145 709/231 |
| 2013/0282649 A1* | 10/2013 | Guanella | G06N 5/00 706/59 |
| 2013/0311495 A1* | 11/2013 | Rossi | G06F 17/30495 707/758 |
| 2013/0338998 A1* | 12/2013 | Freitas | G11C 13/0004 704/9 |
| 2014/0040261 A1* | 2/2014 | Horne | G06F 17/30666 707/737 |
| 2014/0040313 A1* | 2/2014 | Shami | G06F 17/30303 707/780 |
| 2014/0115566 A1* | 4/2014 | Cao | G06F 9/4498 717/129 |
| 2014/0164388 A1* | 6/2014 | Zhang | G06F 17/30911 707/742 |
| 2014/0214748 A1* | 7/2014 | Scislowicz | G06N 5/025 706/47 |
| 2014/0244554 A1* | 8/2014 | Atasu | G06F 9/4498 706/12 |
| 2014/0289264 A1* | 9/2014 | Horne | G06F 17/2705 707/755 |
| 2014/0297665 A1* | 10/2014 | Stevens | G06F 17/30516 707/754 |
| 2014/0298039 A1* | 10/2014 | Pandya | G06F 12/1408 713/190 |
| 2015/0295891 A1* | 10/2015 | Goyal | H04L 63/0209 726/11 |
| 2015/0355891 A1* | 12/2015 | Angerer | G06F 9/4498 717/151 |

OTHER PUBLICATIONS

Extended European Search Report for European Patent Application No. 15191296.1, dated Mar. 21, 2016, 9 pgs.

\* cited by examiner

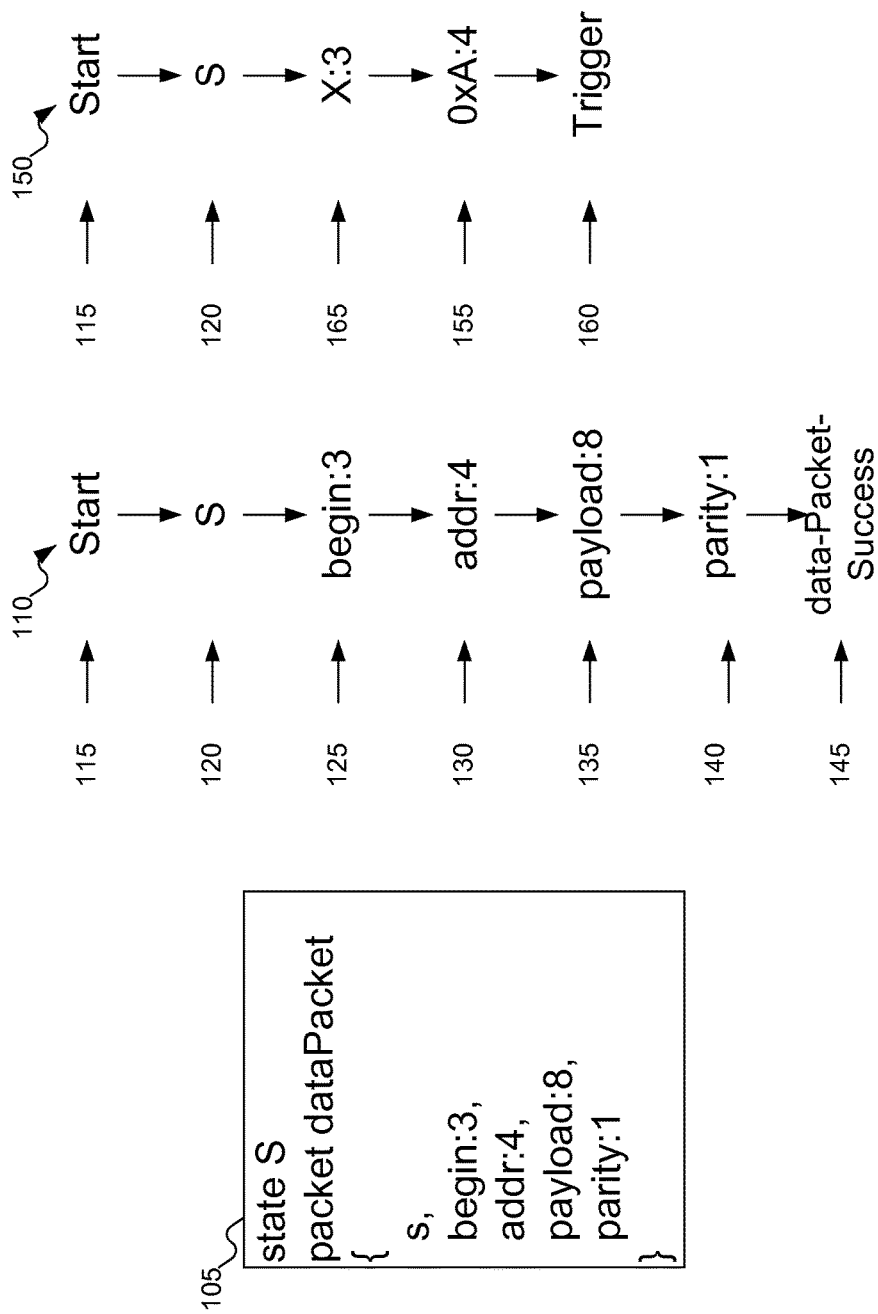

```
state Begin packet Register0Write
{
  Begin,
  SlaveAddress:4
  1,
  data:7,
  parity:1
} packet RegisterRead
{
  Begin,
  SlaveAddress:4,
  0, 1, 1,
  address:5,
  parity:1,
  buspark:1,
  data:8,
  parity:1
} packet RegisterWrite
{
  Begin,
  SlaveAddress:4,
  0, 1, 0,
  address:5,
  parity:1,
  data:8,
  parity:1
}
```

FIG. 2A

HARDWARE TRIGGER GENERATION FROM A DECLARATIVE PROTOCOL DESCRIPTION

RELATED APPLICATION DATA

This application claims the benefit of U.S. Provisional Patent Application Ser. No. 62/068,384, filed Oct. 24, 2014, which is incorporated herein for all purposes.

BACKGROUND

This invention relates to triggers in test-and-measurement instruments, and more particularly to creating triggers from a high-level description of a protocol with user configuration.

Triggering systems have been a part of test-and-measurement instruments for some time. But triggering systems typically depend on conditions associated with the underlying signal: for example, does the signal rise above (or drop below) a threshold voltage. When the data carried by the underlying signal is decoded and verified to match a particular protocol, establishing a trigger condition based on the data is a far more complicated situation, and cannot be done today easily, if at all.

Embodiments of the invention address this and other problems with the prior art.

BRIEF DESCRIPTION OF THE DRAWINGS

FIG. 1A shows an example of a protocol for matching a particular packet

FIG. 1B shows a state machine that can match the packet of FIG. 1A.

FIG. 1C shows a state machine that can trigger on a condition involving the data of the packet of FIG. 1A.

FIG. 2A shows a second example of a protocol for matching several packets.

DETAILED DESCRIPTION

Figure 2B:
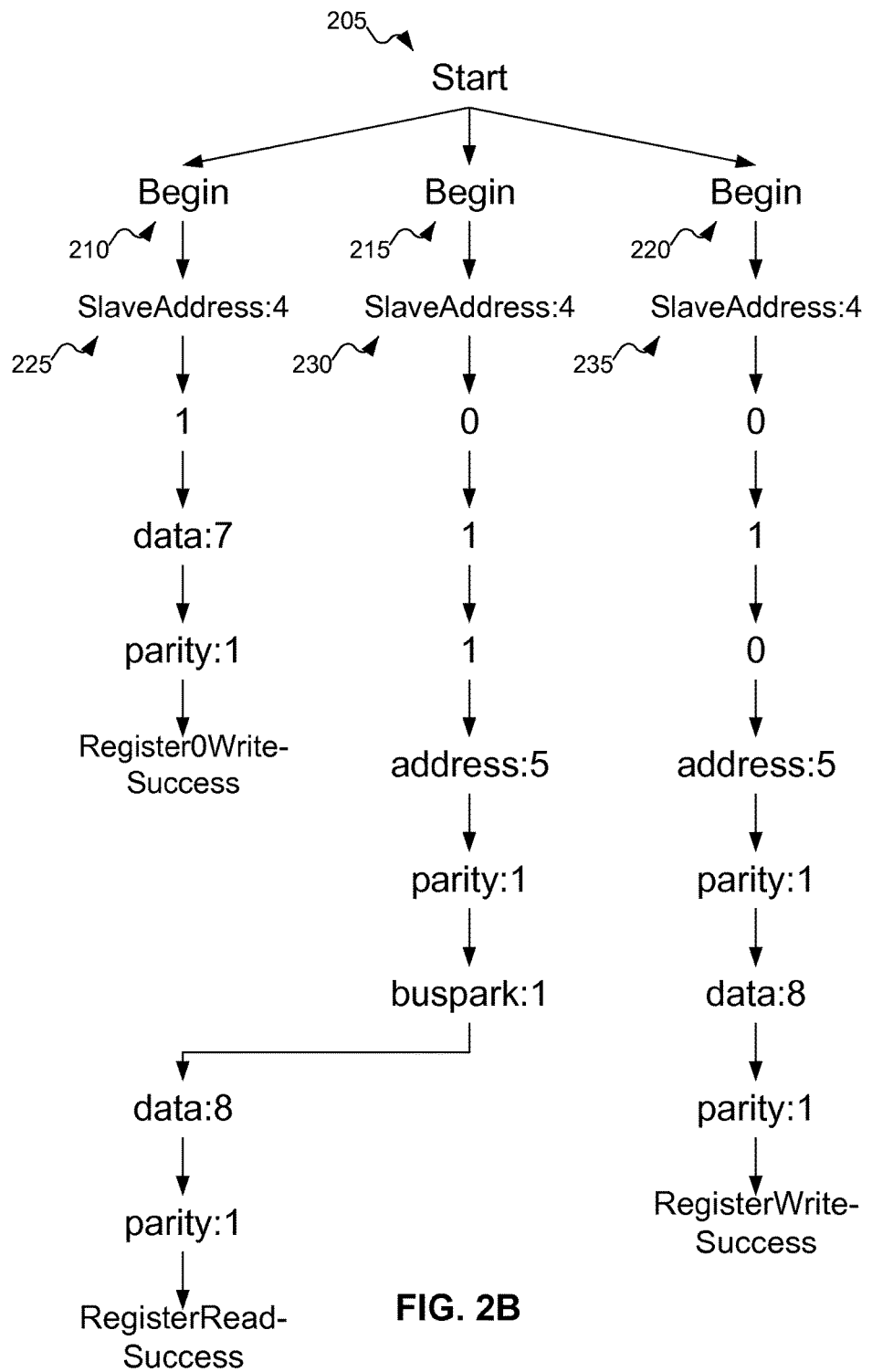
FIG. 2B shows an un-optimized state machine to match the packets of FIG. 2A.

Before explaining how the invention operates, it is useful to understand the relationship between regular expressions and state machines. Given a regular expression, a state machine can be constructed that represents that regular expression. The state machine can then be used to determine whether a particular input matches the regular expression. If the state machine processes to an acceptable end state, then the input matches the regular expression; otherwise, the input does not match the regular expression.

FIG. 1A shows an example of a protocol for a packet of data named "dataPacket", expressed as a regular expression. Protocol 105 describes a packet of data. When a bit stream is compared against this regular expression, the system can determine if the packet is found within the bit stream.

FIG. 1B shows a state machine that corresponds to the regular expression of FIG. 1A. State machine 110 includes states 115, 120, 125, 130, 135, 140, and 145, with transitions between these states. Each state (which can also be called a node or vertex) describes what data needs to be matched to enter the state (the acceptance criterion). Each arrow is a path that can be traversed provide the target acceptance criterion for the state is met. Aside from start state 115 and success state 145, these states correspond sequentially to the data expected by the packet. Thus, state 120 matches a state S within the bit stream, state 125 matches three bits of data against the field labeled "begin", state 130 matches four bits of data against the field labeled "addr", and so on. Assuming that all the data can be matched by the states of state machine 110, when success state 145 is reached, the system can declare that the packet "dataPacket" has been successfully matched.

State machine 110 represents a simplified version of the actual state machine. For example, state machine 110 does not label the transitions between the various states, nor does state machine 110 show error states or transitions that are used when data does not match what is expected. A person skilled in the art would understand how state machine 110 operates, even without these details.

Formally, in mathematical terms, a state machine can be represented as a quintuple $(\Sigma, S, s_0, \delta, F)$, where $\Sigma$ is the alphabet (the set of symbols recognized by the state machine), S is the set of states in the state machine, $s_0$ is the initial state, $\delta$ is the transition function, which maps from each state in S and each symbol in $\Sigma$ to a state in S (which could be the same state as the input state), and F is the set of final states in S. Thus, state machine 110 could be more formally represented as $(\Sigma, S, s_0, \delta, F)$, where:

$\Sigma = \{S, 0, 1, \ldots\}$ (there could potentially be more symbols recognized than just the state S and binary values 0 and 1, even though these are the only symbols recognized by the state machine)

$S = \{110, 115, 120, 125, 130, 135, 140, 145\}$ $s_0 = 110$ $\delta$ ($\delta$ is not expressed in more detail here because expressing the complete transition function would be very cumbersome and of little value)

$F = \{145\}$

In fact, this expression of state machine 110 is not necessarily complete. Transitions typically occur on individual symbols, rather than groups of symbols. Thus, transitioning from state 120 to 125 can actually involve three transitions (and therefore some intermediate states): one for each bit recognized for the field labeled "begin". But as a simplification, a person skilled in the art would understand how state machine 110 operates.

A user might want to trigger some process if a particular value is read for a given state in state machine 110. For example, a user might want to trigger a process if the address field stores the value 10 (in binary, 1010; in hexadecimal, A). FIG. 1C shows an example of how state machine 110 can be modified to implement this trigger. In FIG. 1C, instead of matching against any possible value for the address field, state machine 150 compares the bit stream with the specific value 1010 (in state 155). If that value is found, then at state 160, the trigger is considered satisfied, and the trigger causes the process to start (whatever that process might be).

Note that states 115 and 120 are the same in state machine 150 as in state machine 110: state 115 is a state in which the state machine starts, and state 120 matches state S from the bit stream. But state 165 is different from state 125, in that state 165 does not care about the particular field being read. Put another way, in state 165 all that matters is that three bits are read from the bit stream. State 155 is also different from state 130, as state 155 is concerned only with matching the particular bit pattern 1010, rather than matching the address field (as in state 130). Finally, once the user condition has been matched, no further matching needs to be done, so state machine 150 does not include analogs to states 135 and 140: the trigger can be issued immediately after the condition is met.

FIGS. 1A-1C show a fairly simple example of a regular expression, state machine to match the regular expression, and trigger state machine. (Trigger state machines are sometimes referred to simply as "state machines", but from context a person skilled in the art can determine if a particular state machine is a trigger state machine or a state machine to match a regular expression.) FIGS. 2A-2D show a more complicated example. In FIG. 2A, regular expressions for three different packets are shown. These regular expressions can be converted into a state machine, as shown in FIG. 2B. Note that state machine 205 in FIG. 2B uses a single start state to cover all three possible protocols.

State machine 205 can be used as shown. But using state machine 205 as shown would require look-ahead or backtracking, which requires additional memory and can slow down processing of a bit stream. For example, assume that where multiple states can be reached given a particular input, the left-most (as FIG. 2B would be read by a person, rather than how a processor might use state machine 205). For example, note that states 210, 215, and 220 all match Begin states, and states 225, 230, and 235 all match 4 bits as a slaveAddress field. Using a left-most first approach, after reading a Begin state and 4 bits as the slaveAddress field, the system would be in state 225. But if the next bit read would be a 0, then the system would be following the wrong branch of state machine 205, and would have to unwind the processing of state machine 205 to attempt to find the correct branch. This is an example of backtracking. It should be apparent that having to reverse state machine 205 and process a different branch can slow down processing of the bit stream. Avoiding backtracking using state machine 205 would require look-ahead processing: the system would have to somehow look at bits yet to come in the bit stream. Look-ahead is also complicated and expensive.

Figure 2C:
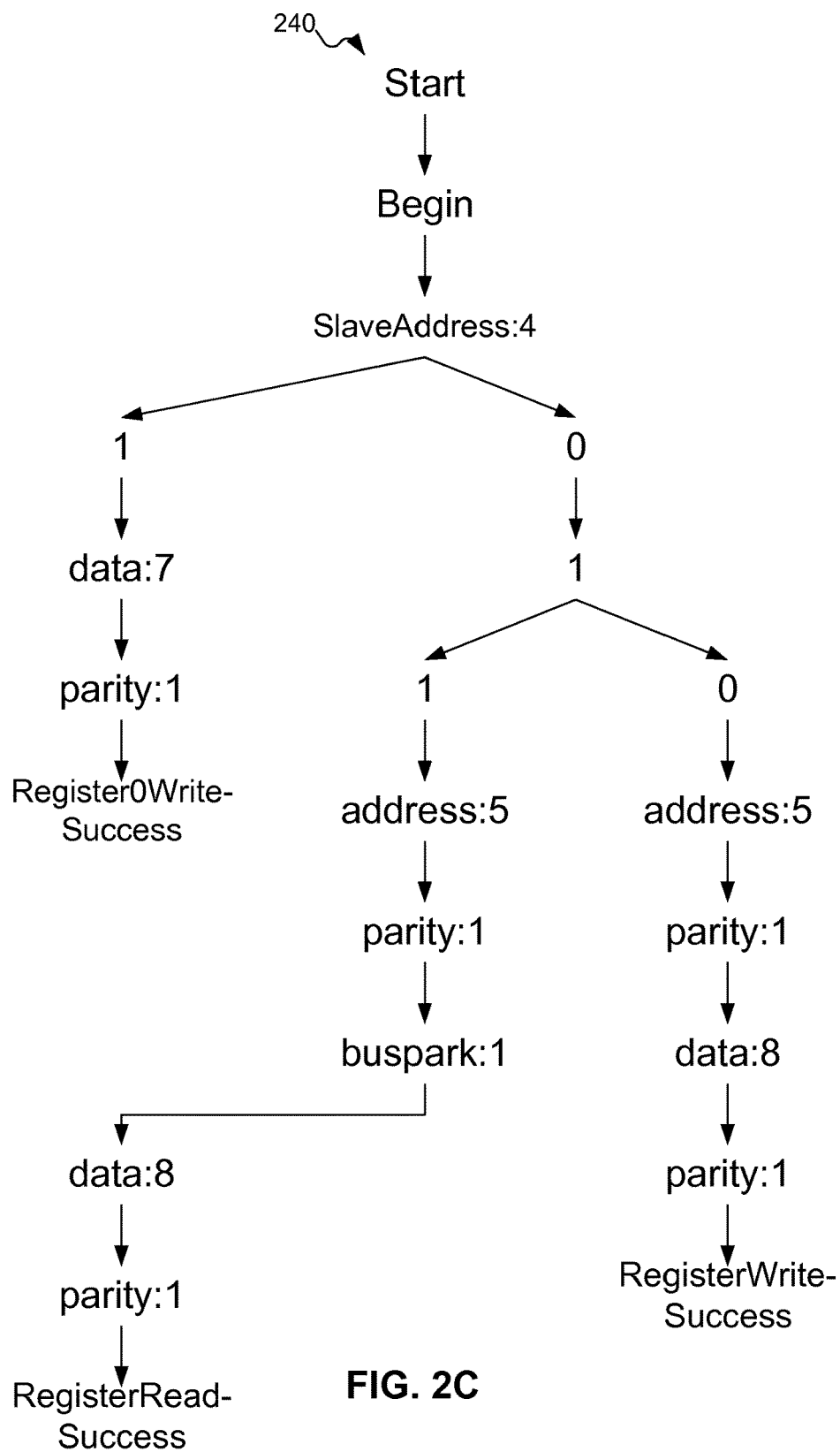
FIG. 2C shows an optimized state machine to match the packets of FIG. 2A.

To avoid both backtracking and look-ahead, state machine 205 can be optimized. State machine 240 in FIG. 2C shows an example of an optimized state machine. With state machine 240, there is no need to look ahead, and no concern about backtracking. Given any prefix (up to and including the entire packet) of any of the packets, there is only one possible path through state machine 240 that matches that prefix. Therefore, there is no need to perform look-ahead, and no need to worry about backtracking: given a particular state in state machine 240 and a particular input symbol, there is only one possible state to transition to (this state might be an error state, not shown in FIG. 2C for simplicity).

Optimization can be accomplished using the following procedure. Start by walking the tree from the start state and combining the nodes (that is, merge the nodes into a single node) that are equivalent and have the same parent. This process can be repeated until there are no more like nodes to combine. Then find the equivalent Success states, combine them, and then combine nodes that are equivalent and have the same children (again, repeating the process until there are no more like nodes to combine).

Figure 2D:
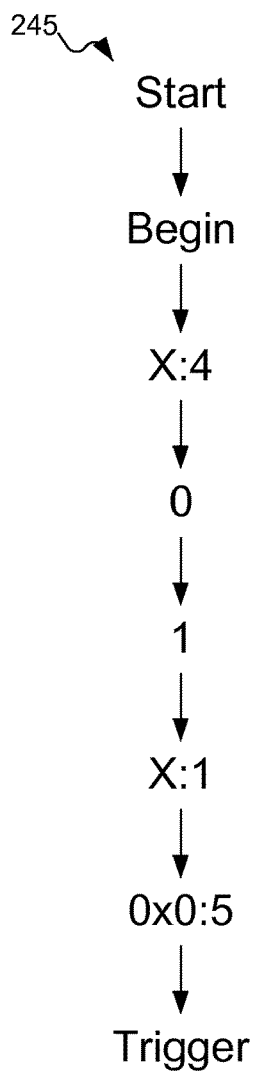
FIG. 2D shows a state machine that can trigger on a condition involving the data of the packets of FIG. 2A.

FIG. 2D shows an example of a particular trigger customized by the user. In FIG. 2D, the user has selected to trigger when the address field (not the slaveAddress field) of a packet in the regular expression is set to the value 0. Since this field does not appear in the packet Register0Write, this entire branch of the state machine can be eliminated from trigger state machine 245. Any value can be matched against the slaveAddress field, after which the bits 0 and 1 must be matched. Any bit can occur after that (although the actual bit would depend on the particular packet being read, trigger state machine 245 does not care which value is received), after which the bits for the address field are received, and can be compared with the value 0. If the value 0 is matched for the address field, then trigger state machine 245 has succeeded, and the trigger can be initiated.

The above examples use a single trigger criterion, expressed as an equality. But there is no reason to limit the trigger condition to an equality. Aside from equality (==), examples of other trigger conditions can be inequality (!=), less than (<), less than or equal to (<=), greater than (>), or greater than or equal to (>=). In addition, the trigger condition might depend on only a subset of information from the field in the regular expression. For example, in FIG. 2D, the user might only be interested in whether the middle three bits of the address field are equal to 001: the first and last bit in the address field (which has a total of five bits) can match any value. It is also possible to set a trigger condition that depends merely on reaching a particular state. For example, the user might be interested in knowing when the address field is reached, regardless of its actual value.

In addition, trigger conditions do not have to be limited to a single criterion (which can be termed a simple trigger condition). The user can specify multiple criteria (compound trigger conditions), combined using AND and OR operators, in any desired combination. Thus, the state machine might be testing for multiple conditions, any of which might involve a set of sub-conditions, and so on. A person skilled in the art would know how to simplify the user's provided condition into disjunctive normal form or conjunctive normal form, as desired, which might simplify the design of the state machine. (Disjunctive normal form refers to a logical formula expressed as a disjunction of conjunctive clauses: that is, an OR of ANDs. Conjunctive normal form similarly describes an AND of ORs.)

Figure 3B:
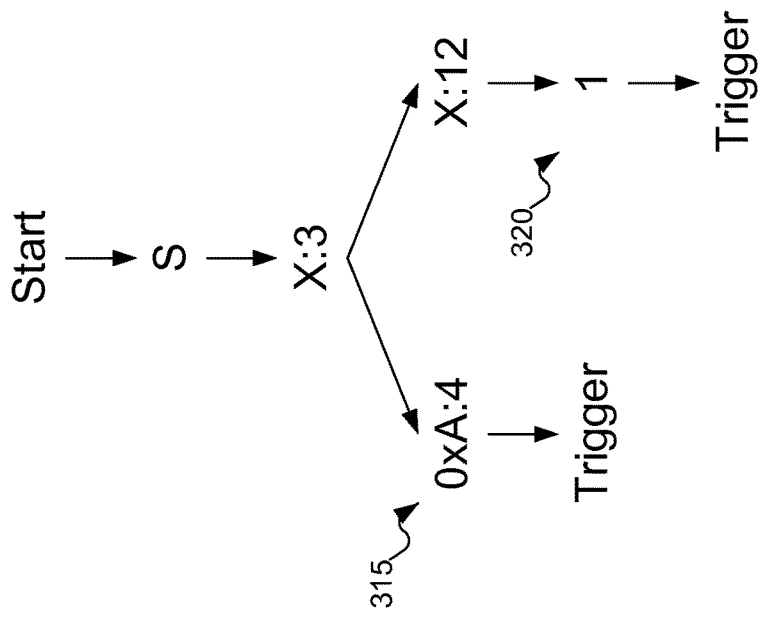
FIGS. 3A-3B show the state machine of FIG. 1B modified to reflect compound trigger conditions.
Figure 3A:
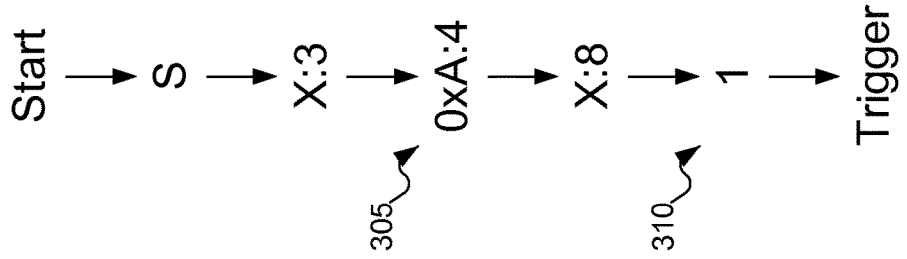

FIGS. 3A-3B show examples of state machines with compound trigger conditions. In FIG. 3A, the user has specified the trigger condition of (addr==0xA && parity 1). Such a trigger condition is a conjunction of the two conditions. Because the trigger condition requires that two states both have specified values, two states in the state machine are set to specific values (as specified by the user); the values for other states are generally not important, and can be combined into a single state.

In FIG. 3B, the user has specified a trigger condition of (addr==0xA||parity==1): a disjunctive trigger condition. Because the trigger condition requires one of two states to have a specified value, two state machines, with the separate conditions, can be established and merged using the optimization techniques described earlier. Note that even though the trigger condition applies to a single state machine, because of the disjunction, there are two possible paths to a successful trigger.

FIGS. 3A-3B give examples involving a single AND or OR combining two possible trigger values. But it should be apparent that the process can be generalized for more complicated trigger conditions. For example, if the trigger condition involves two values joined by an AND operation, or another value (an expression of the form ((X AND Y) OR Z), then the state machine can be copied. One copy can be modified to reflect the first value of the AND operation; a second copy can be modified to reflect the second value of the AND operation; and the third copy can be modified to reflect the other value of the OR operation. The first two state machines can then be combined and optimized as described above to represent the AND operation, and that state machine can then be combined and optimized with the third state machine to represent the compound trigger condition.

Figure 4:
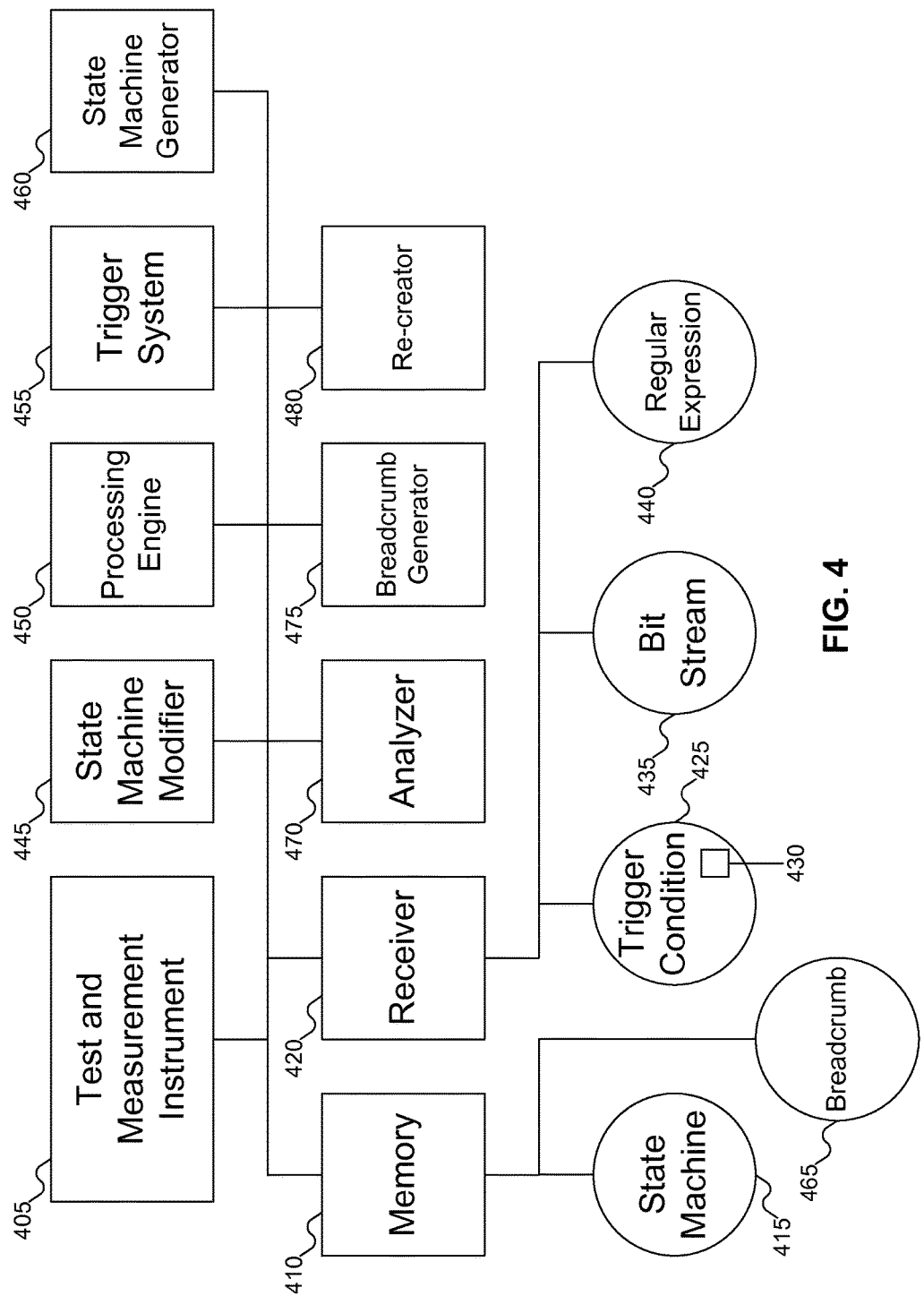
FIG. 4 shows a test-and-measurement instrument that can create and use the state machines of FIGS. 1B-1C and 2B-2D to trigger the test-and-measurement instrument when various trigger conditions are met, and to save breadcrumbs into memory reflecting the operation of the state machines of FIGS. 1B-1C and 2B-2D, according to an embodiment of the invention.

Now that trigger state machines have been described, a system that can use trigger state machines can be described. FIG. 4 shows a test-and-measurement instrument that can create and use the state machines of FIGS. 1B-1C and 2B-2D to trigger the test-and-measurement instrument when various trigger conditions are met, according to an embodiment of the invention. The system can include test-and-measurement instrument 405. Test-and-measurement instrument can be any desired test-and-measurement instrument, such as an oscilloscope, among other possibilities.

Test-and-measurement instrument 405 can include memory 410. Memory 410 can store information, such as state machine 415. State machine 415 can be a state machine used to match a regular expression: in other words, a state machine such as state machines 110, 205, and 240 of FIGS. 1B, 2B, and 2C). State machine 415 can also be a trigger state machine, such as state machines 150 and 245 of FIGS. 1C and 2D.

Test-and-measurement instrument 405 can also include receiver 420, which can receive input into test-and-measurement instrument 405. Input can be received in any number of ways. For example, receiver 420 can include a user interface for a user to input information, such as trigger condition 425, which itself can include, for example, user-selected value 430 for a particular bit field. Or, receiver 420 can include receive a signal that includes a bit stream, such as bit stream 435, to be analyzed. Receiver 420 can also receive regular expression 440 (for example, through an integrated development environment (IDE), which can identify the data the system should expect to receive in bit stream 435, and which can be used to construct state machine 415 (be it a state machine to recognize regular expression 440 or a trigger state machine).

Test-and-measurement instrument 405 can also include various other units. State machine modifier 445 can take an existing state machine (for example, one that matches data to regular expression 440) and modifies it to operate as a trigger state machine. As discussed above, this can include eliminating states that occur after the trigger condition is satisfied, and combining states whose values are not considered as part of the trigger condition, among other possibilities.

Processing engine 450 can process bit stream 435 using various state machines (including, for example, a state machine generated using regular expression 440 or a trigger state machine produced using state machine modifier 445). This processing can include updating the current state for each various state machine, as bits are read from bit stream 435.

Trigger system 455 can send a trigger when the trigger condition is met (that is, when the trigger state machine is satisfied. Trigger system 455 can send the trigger to any desired component of test-and-measurement instrument 405 to perform any action as a result of the trigger, as would be understood by person of ordinary skill in the art.

State machine generator 460 can generate a state machine from regular expression 440. As discussed above, this can include creating a sequential series of states that match fields in the order presented in the regular expression. This can also include combining various state machines that match different regular expressions into a single state machine, and optimizing a state machine to avoid look-ahead and back-tracking problems.

Aside from generating and using trigger state machines, test-and-measurement instrument 405 can also be used to generate breadcrumbs. Breadcrumbs let a user recreate the operation of a state machine, to see how data was processed. Breadcrumbs, such as breadcrumb 465, are bits of data that can be stored in memory 410. Essentially, whenever a state in a state machine is entered, a breadcrumb can be saved. A breadcrumb can include data, such as the type of state (e.g., error state, packet start, packet end, or field), an ID for the state (that can identify the field or packet), and a time, such as the start and/or stop time of the data that caused the state entry. A person skilled in the art will recognize that "time" does not have to refer to the literal concept of time (as in seconds or fractions thereof since the start of the signal), but rather can refer to an index into a signal, among other possibilities. Breadcrumbs can also include additional data pertinent to analysis, as appropriate. Therefore, the identification of the data to be included in the breadcrumbs can be user-customized.

Breadcrumbs are usually generated using a trigger state machine. But a person skilled in the art will recognize that there is no reason why any other state machine cannot be used to generate breadcrumbs, and therefore breadcrumbs can be generated using any state machine.

To support breadcrumb generation, test-and-measurement instrument 405 can include analyzer 470. Analyzer 470 can analyze bit stream 435 using a state machine. In operation, analyzer 470 is similar to processing engine 450, but their objectives are different. Whereas processing engine 450 is concerned with matching bits from bit stream 435 to attempt to recognize regular expressions, analyzer 470 is concerned with determining when to save a breadcrumb to memory 410. Analyzer 470 and processing engine 450 also typically operate on different state machines: analyzer 470 usually uses (but does not have to use) a trigger state machine, whereas processor 450 uses a full state machine to match a regular expression.

Test-and-measurement instrument 405 can also include breadcrumb generator 475. When it is time to generate a breadcrumb (e.g., when a new state is entered as determined by analyzer 470), breadcrumb generator 475 can save the breadcrumb to memory 410.

Finally, test-and-measurement instrument 405 can include re-creator 480. Re-creator 480 permits a user to re-create the operation of the state machine (as processed by analyzer 470) on bit stream 435. This recreation enables the user to follow what happened.

Test-and-measurement instrument 405 as described can process either the trigger state machine or the breadcrumb generation, or both. Some test-and-measurement instruments include the necessary hardware and/or software to process multiple state machines. If a test-and-measurement instrument is capable of processing multiple state machines, then test-and-measurement instrument 405 can perform both processing for trigger conditions and breadcrumbs.

Figure 5:
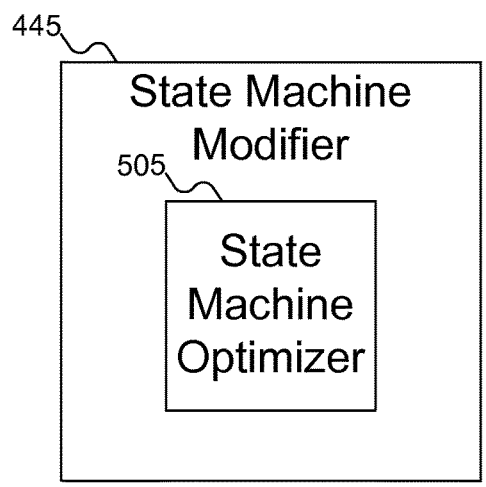
FIG. 5 shows more detail about the state machine modifier of FIG. 4.

FIG. 5 shows more detail about the state machine modifier of FIG. 4. In FIG. 5, state machine modifier 445 is shown as including state machine optimizer 505. State machine optimizer 505 can optimize a state machine, as described above. Such optimization can be either for a state machine designed to match a regular expression or for a trigger state machine.

Figure 6:
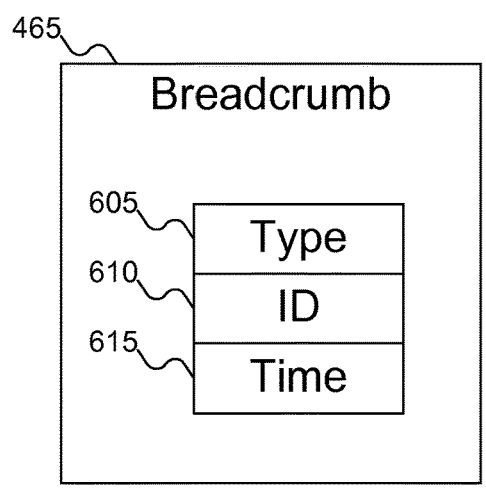
FIG. 6 shows more detail about the breadcrumbs of FIG. 4.

FIG. 6 shows more detail about the breadcrumbs of FIG. 4. In FIG. 6, breadcrumb 465 is shown as including type 605, ID 610, and time 615. As discussed above, type 605 can specify the type of state which generated breadcrumb 465. ID 610 can specify the specific state in the state machine that generated breadcrumb 465. And time 615 can specify the time (or index) in the signal when the state generated breadcrumb 465.

Figure 7A:
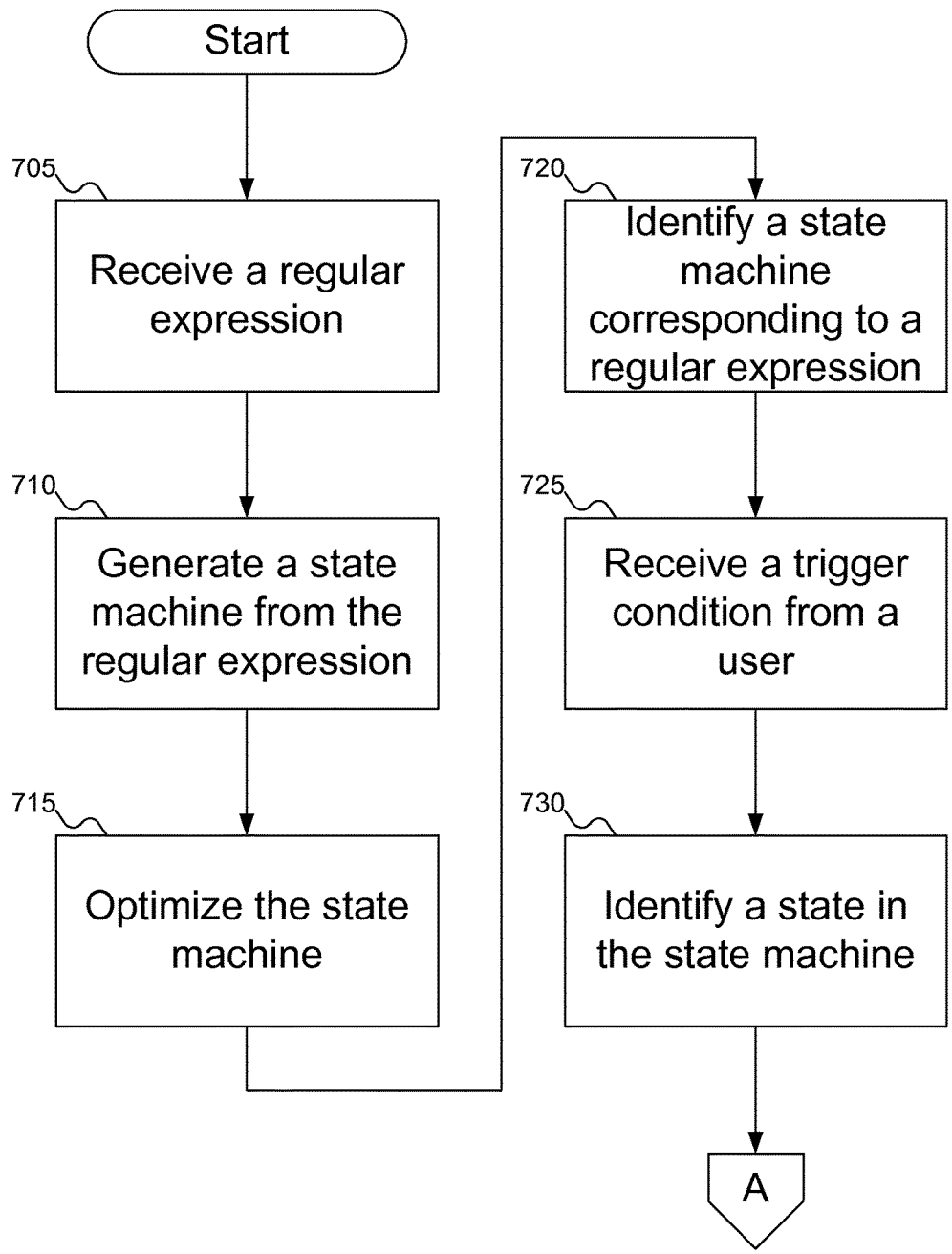
FIGS. 7A-7B show a flowchart of a procedure for creating a trigger state machine from a protocol and user configuration using the test-and-measurement instrument of FIG. 4, according to an embodiment of the invention.
Figure 7B:
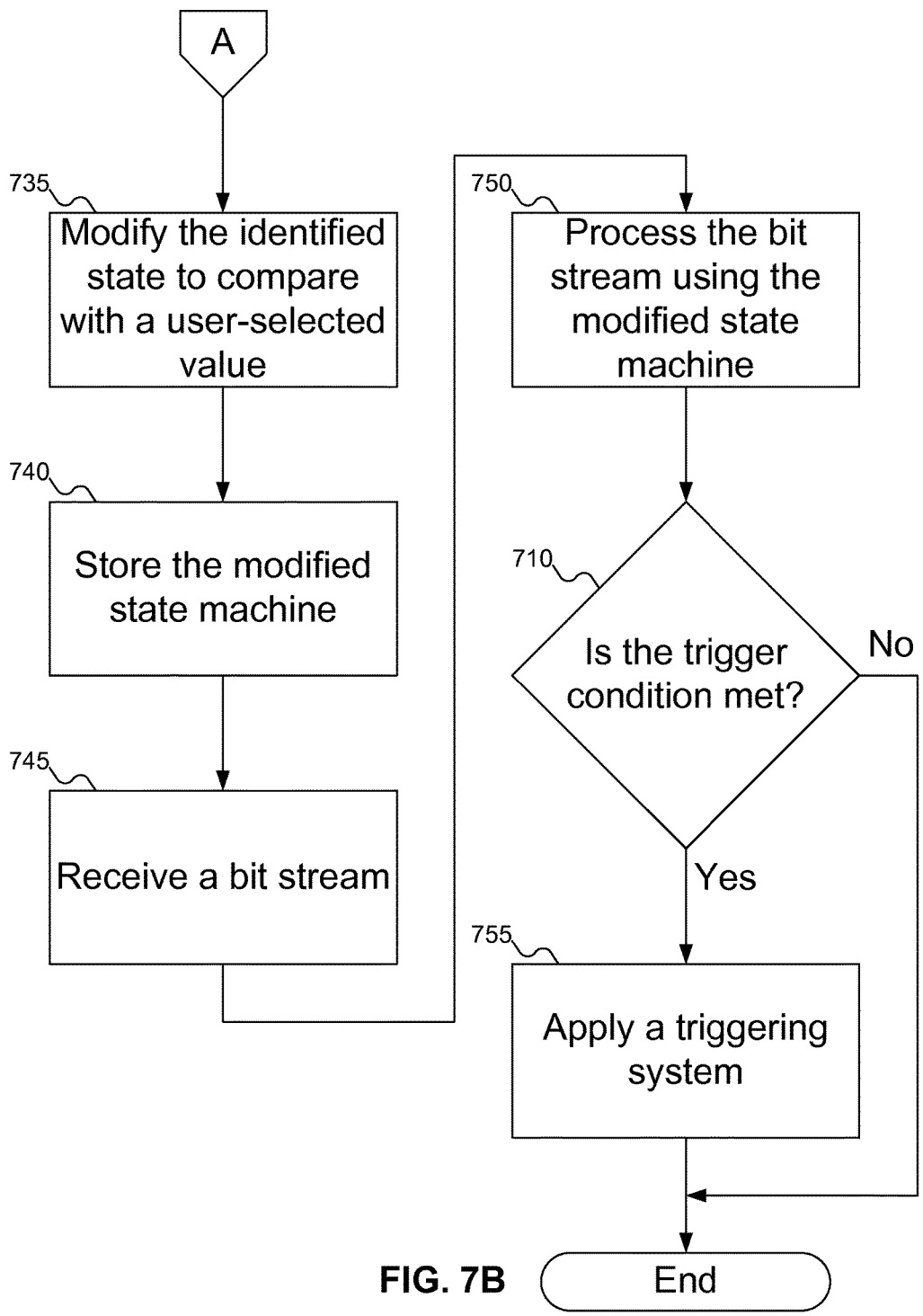

FIGS. 7A-7B show a flowchart of a procedure for creating a trigger state machine from a protocol and user configuration using the test-and-measurement instrument of FIG. 4, according to an embodiment of the invention. In FIG. 7A, at block 705, the system can receive a regular expression. At block 710, the system can generate a state machine that corresponds to the regular expression. At block 715, the system can optimize the state machine.

At block 720, the system can identify the state machine corresponding to a regular expression (which can be the same state machine generated in blocks 705-715). At block 725, the system can receive a trigger condition from the user. This can include, for example, a user-specified value (or part of a value) for a particular field in the regular expression, multiple such user-specified values, or even just a field to be reached, among other possibilities. At block 730, the system can identify a state (or more than one state) in the state machine that can be modified to implement the trigger condition.

At block 735 (FIG. 7B), the system can modify the identified state(s) to compare with the user-selected value. At block 740, the system can store the modified state machine. At block 745, the system can receive a bit stream. At block 750, the system can process the bit stream using the modified state machine. At block 710, the system can determine if the trigger condition was met. If so, then at block 755 the system can apply a triggering system.

Figure 8:
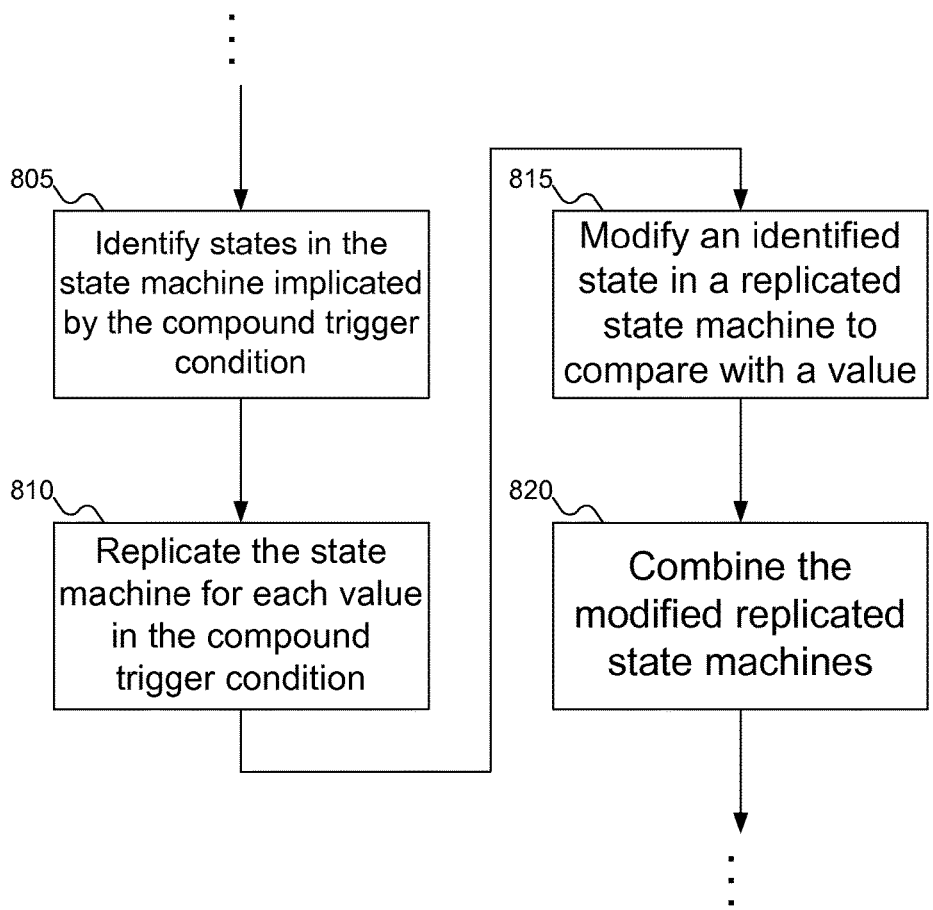
FIG. 8 shows a flowchart of a procedure for creating a trigger state machine from a protocol and a compound trigger condition using the test-and-measurement instrument of FIG. 4, according to an embodiment of the invention.

As discussed above, a trigger condition can be a compound trigger condition. In that case, the flowchart of the procedure can be modified to reflect the compound nature of the trigger condition. FIG. 8 reflects this change. FIG. 8 modifies blocks 730 and 735 of FIGS. 7A-7B: the other blocks in FIGS. 7A-7B are unmodified and therefore not shown in FIG. 8.

In FIG. 8, at block 805, the system identifies states that are implicated by the compound trigger condition. The number of implicated states might be less than the number of simple conditions included in the compound trigger condition. For example, a compound trigger condition for the state machine shown in FIG. 1B might be (addr==0xA||addr==0xF). Note that the same state is used in both sides of the compound trigger condition. At block 810, the system replicates the state machine once for each simple trigger condition in the compound trigger condition. Continuing the above example, the compound trigger condition includes two simple trigger conditions (addr==0xA and addr==0xF), so the system would generate two replicas of the state machine. At block 815, within each replicated state machine, an identified state is modified to reflect the comparison with the user-specified value. Finally, at block 820, the modified replicated state machines can be combined to produce a single state machine that reflects the compound trigger condition. At this point, processing can continue with block 740 of FIG. 7B.

Figure 9:
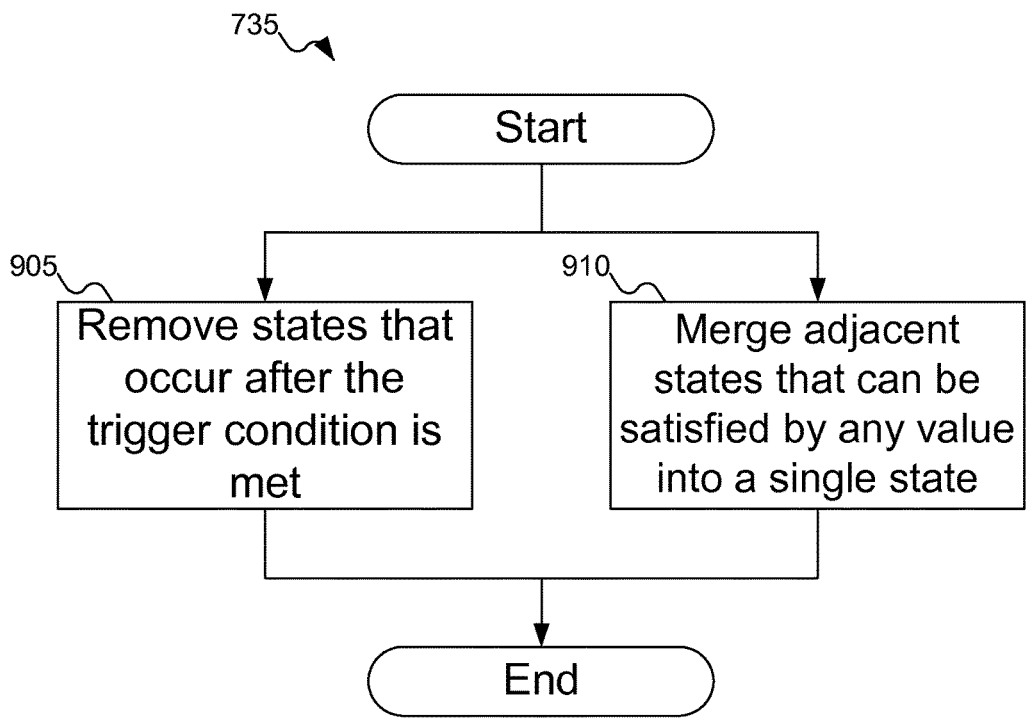
FIG. 9 shows a flowchart of a procedure for optimizing a state machine using the test-and-measurement instrument of FIG. 4, according to an embodiment of the invention.

FIG. 9 shows a flowchart of a procedure for optimizing a state machine using the test-and-measurement instrument of FIG. 4, according to an embodiment of the invention. In FIG. 9, at block 905, the system can remove states that occur after the trigger condition is met. At block 910, the system can merge adjacent states that can be satisfied by any value into a single state.

Figure 10:
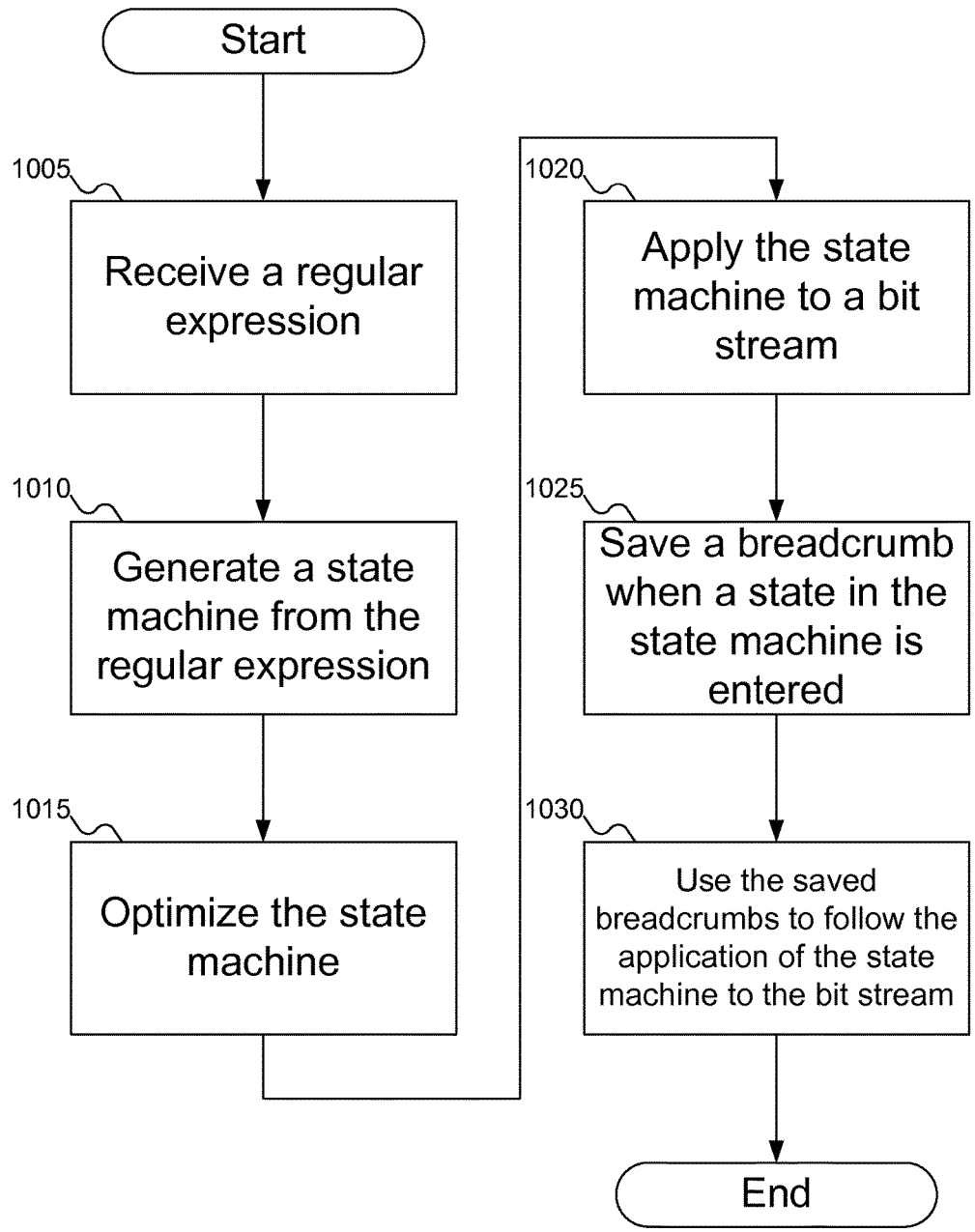
FIG. 10 shows a flowchart of a procedure for using creating a state machine that can save breadcrumbs using the test-and-measurement instrument of FIG. 4, according to an embodiment of the invention.

FIG. 10 shows a flowchart of a procedure for using creating a state machine that can save breadcrumbs using the test-and-measurement instrument of FIG. 4, according to an embodiment of the invention. At block 1005, the system can receive a regular expression. At block 1010 the system can generate a state machine from the regular expression. At block 1015, the system can optimize the state machine. At block 1020, the system can apply the state machine to a bit stream. At block 1025, the system can save a breadcrumb whenever a state in the state machine is entered. At block 1030, the system can use the saved breadcrumbs to recreate the application of the state machine to the bit stream.

The above flowcharts show some possible embodiments of the invention. But other embodiments of the invention can organize the blocks in different arrangements, and can include or omit different blocks as desired, or repeat a block (or multiple blocks) as needed. Embodiments of the invention are intended to include all such variations on the flowcharts.

Embodiments of the invention can extend to the following statements, without limitation:

An embodiment of the invention includes a system, comprising: a test-and-measurement instrument; a memory in the test-and-measurement instrument, the memory storing a state machine, the state machine corresponding to a regular expression; a receiver to receive from a user a trigger condition; and a state machine modifier to modify the state machine to reflect the trigger condition.

An embodiment of the invention includes a system, comprising: a test-and-measurement instrument; a memory in the test-and-measurement instrument, the memory storing a state machine, the state machine corresponding to a regular expression; a receiver to receive from a user a compound trigger condition; and a state machine modifier to modify the state machine to reflect the compound trigger condition.

An embodiment of the invention includes a system, comprising: a test-and-measurement instrument; a memory in the test-and-measurement instrument, the memory storing a state machine, the state machine corresponding to a regular expression; a receiver to receive from a user a compound trigger condition; and a state machine modifier to modify the state machine to reflect the compound trigger condition, wherein the state machine modifier is operative to replicate the state machine for each value in the compound trigger condition, modify each replicated state machine to incorporate one value of the compound trigger condition, and combine the modified replicated state machines.

An embodiment of the invention includes a system, comprising: a test-and-measurement instrument; a memory in the test-and-measurement instrument, the memory storing a state machine, the state machine corresponding to a regular expression; a receiver to receive from a user a trigger condition and a bit stream; a state machine modifier to modify the state machine to reflect the trigger condition; a processing engine to process the bit stream using the state machine; and a trigger system to send a trigger if the trigger condition is met.

An embodiment of the invention includes a system, comprising: a test-and-measurement instrument; a memory in the test-and-measurement instrument, the memory storing a state machine, the state machine corresponding to a regular expression; a receiver to receive from a user a trigger condition; and a state machine modifier to modify the state machine to reflect the trigger condition, including a state machine optimizer.

An embodiment of the invention includes a system, comprising: a test-and-measurement instrument; a memory in the test-and-measurement instrument, the memory storing a state machine, the state machine corresponding to a regular expression; a receiver to receive from a user a trigger condition; and a state machine modifier to modify the state machine to reflect the trigger condition, including a state machine optimizer, wherein the state machine optimizer is operative to remove any states that occur after the trigger condition is met from the modified state machine.

An embodiment of the invention includes a system, comprising: a test-and-measurement instrument; a memory in the test-and-measurement instrument, the memory storing a state machine, the state machine corresponding to a regular expression; a receiver to receive from a user a trigger condition; and a state machine modifier to modify the state machine to reflect the trigger condition, including a state machine optimizer, wherein the state machine optimizer is operative to combine states that can be satisfied in the trigger condition by any value into a single state.

An embodiment of the invention includes a system, comprising: a test-and-measurement instrument; a memory in the test-and-measurement instrument, the memory storing a state machine, the state machine corresponding to a regular expression; a receiver to receive from a user a trigger condition; and a state machine modifier to modify the state machine to reflect the trigger condition, wherein the state machine modifier is operative to set the state machine to compare the bit stream with a user-selected value.

An embodiment of the invention includes a system, comprising: a test-and-measurement instrument; a memory in the test-and-measurement instrument, the memory storing a state machine, the state machine corresponding to a regular expression; a receiver to receive from a user a trigger condition and the regular expression; a state machine generator to generate the state machine from the regular expression; and a state machine modifier to modify the state machine to reflect the trigger condition.

An embodiment of the invention includes a system, comprising: a test-and-measurement instrument; a memory in the test-and-measurement instrument, the memory storing a state machine, the state machine corresponding to a regular expression; a receiver to receive from a user a trigger condition; a state machine modifier to modify the state machine to reflect the trigger condition; and a state machine optimizer to optimize the state machine.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user; and storing the modified state machine in the test-and-measurement instrument.

An embodiment of the invention includes a method, comprising: identifying a state machine stored in a test-and-measurement instrument, the state machine corresponding to a regular expression; receiving from a user a compound trigger condition; identifying a plurality of states in the state machine used in the compound trigger condition received from the user; replicating the state machine for each value in the compound trigger condition; modifying the identified state in the state machine to reflect the trigger condition received from the user, including replicating the state machine for each value in the compound trigger condition, modifying an identified state in the replicated state machine to reflect a corresponding value in the trigger condition received from the user, and combining the replicated state machines; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user; storing the modified state machine in the test-and-measurement instrument; receiving a bit stream; processing the bit stream using the modified state machine; and if the state machine indicates that the trigger condition is met, applying a triggering system of the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user including optimizing the modified state machine; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user including optimizing the modified state machine including removing any states that occur after the trigger condition is met from the modified state machine; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user including optimizing the modified state machine including merging adjacent states that can be satisfied in the trigger condition by any value into a single state; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user; modifying the identified state in the state machine to reflect the trigger condition received from the user including modifying the identified state to compare the bit stream with a user-selected value; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user including receiving the regular expression from the user and generating the state machine from the regular expression; modifying the identified state in the state machine to reflect the trigger condition received from the user; and storing the modified state machine in the test-and-measurement instrument.

An embodiment of the invention includes a method, comprising: identifying a state machine stored in a test-and-measurement instrument, the state machine corresponding to a regular expression; receiving from a user a trigger condition; identifying a state in the state machine used in the trigger condition received from the user including optimizing the state machine; modifying the identified state in the state machine to reflect the trigger condition received from the user; and storing the modified state machine in the test-and-measurement instrument.

The following discussion is intended to provide a brief, general description of a suitable machine in which certain aspects of the invention may be implemented. Typically, the machine includes a system bus to which is attached processors, memory, e.g., random access memory (RAM), read-only memory (ROM), or other state preserving medium, storage devices, a video interface, and input/output interface ports. The machine may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, or a system of communicatively coupled machines or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine may include embedded controllers, such as programmable or non-programmable logic devices or arrays, Application Specific Integrated Circuits, embedded computers, smart cards, and the like. The machine may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciated that network communication may utilize various wired and/or wireless short range or long range carriers and protocols, including radio frequency (RF), satellite, microwave, Institute of Electrical and Electronics Engineers (IEEE) 810.11, Bluetooth, optical, infrared, cable, laser, etc.

The invention may be described by reference to or in conjunction with associated data including functions, procedures, data structures, application programs, etc. which when accessed by a machine results in the machine performing tasks or defining abstract data types or low-level hardware contexts. Associated data may be stored on tangible computer-readable media as non-transitory computer-executable instructions. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Having described and illustrated the principles of the invention with reference to illustrated embodiments, it will be recognized that the illustrated embodiments may be modified in arrangement and detail without departing from such principles. And, though the foregoing discussion has focused on particular embodiments, other configurations are contemplated. In particular, even though expressions such as "in one embodiment" or the like are used herein, these phrases are meant to generally reference embodiment possibilities, and are not intended to limit the invention to particular embodiment configurations. As used herein, these terms may reference the same or different embodiments that are combinable into other embodiments.

What is claimed is:

1. An oscilloscope, comprising:
   a memory configured to store a state machine, the state machine corresponding to a protocol expressed as a regular expression;
   a receiver operative to receive a signal representing a bit stream, and configured to receive from a user a trigger condition related to a state of the state machine;
   a state machine modifier to modify the state machine into a trigger state machine reflecting the trigger condition;
   a processing engine to process the bit stream according to the trigger state machine; and
   a trigger system to trigger the oscilloscope to acquire a portion of the signal when the trigger condition is met,
   wherein the processing engine compiles the trigger state machine into an op code representation suitable for loading into the trigger system; wherein the processing engine ignores trigger state machine definitions that are beyond the hardware capabilities of the trigger system.

2. The oscilloscope according to claim 1, wherein the trigger condition includes a compound trigger condition.

3. The oscilloscope according to claim 2, wherein the state machine modifier is operative to replicate the state machine for each value in the compound trigger condition, modify each replicated state machine to incorporate one value of the compound trigger condition, and combine the modified replicated state machines.

4. The oscilloscope according to claim 1, wherein the state machine modifier includes a state machine optimizer.

5. The oscilloscope according to claim 4, wherein the state machine optimizer is operative to remove any states that occur after the trigger condition is met from the trigger state machine.

6. The oscilloscope according to claim 4, wherein the state machine optimizer is operative to combine states that can be satisfied in the trigger condition by any value into a single state.

7. The oscilloscope according to claim 1, wherein the state machine modifier is operative to set the trigger state machine to compare the bit stream with a user-selected value.

8. The oscilloscope according to claim 1, wherein:
the receiver is operative to receive the regular expression from the user; and
the system further comprises a state machine generator to generate the state machine from the regular expression.

9. The oscilloscope according to claim 8, further comprising a state machine optimizer to optimize the trigger state machine.

10. A method in an oscilloscope having a trigger system, the method comprising:
identifying a state machine stored in a memory of the oscilloscope, the state machine corresponding to a protocol expressed as a regular expression;
receiving from a user a trigger condition related to a state of the state machine;
identifying a state in the state machine used in the trigger condition received from the user;
modifying the identified state in the state machine to reflect the trigger condition received from the user;
storing the modified state machine in the oscilloscope as a trigger state machine;
receiving a signal representing a bit stream;
processing the bit stream using the trigger state machine; and
using the trigger system to trigger the oscilloscope to acquire a portion of the signal when the trigger state machine indicates that the trigger condition is met,
wherein the trigger system is loaded with a translated op code representation of the trigger state machine;
wherein the translated op code representation of the trigger state machine ignores trigger state machine definitions that are beyond the hardware capabilities of the trigger system.

11. A method according to claim 10, wherein:
receiving from a user a trigger condition includes receiving from the user a compound trigger condition;
identifying a state in the state machine used in the trigger condition received from the user includes identifying a plurality of states in the state machine used in the compound trigger condition received from the user; and
modifying the identified state in the state machine to reflect the trigger condition received from the user includes:
replicating the state machine for each value in the compound trigger condition;
modifying an identified state in the replicated state machine to reflect a corresponding value in the trigger condition received from the user; and
combining the replicated state machines.

12. A method according to claim 10, wherein modifying the identified state in the state machine to reflect the trigger condition received from the user includes optimizing the modified state machine.

13. A method according to claim 12, wherein optimizing the modified state machine includes removing any states that occur after the trigger condition is met from the modified state machine.

14. A method according to claim 12, wherein optimizing the modified state machine includes merging adjacent states that can be satisfied in the trigger condition by any value into a single state.

15. A method according to claim 10, wherein modifying the identified state in the state machine to reflect the trigger condition received from the user includes modifying the identified state to compare the bit stream with a user-selected value.

16. A method according to claim 10, wherein identifying a state machine stored in the oscilloscope includes:
receiving the regular expression from the user; and
generating the state machine from the regular expression.

17. A method according to claim 16, wherein identifying a state machine stored in the oscilloscope further comprises optimizing the state machine.

* * * * *